(12) United States Patent
Park

(10) Patent No.: US 6,441,457 B1
(45) Date of Patent: Aug. 27, 2002

(54) FUSE IN SEMICONDUCTOR DEVICE AND FABRICATING METHOD THEREOF

(75) Inventor: Hyun-Suck Park, Taegu (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 66 days.

(21) Appl. No.: 09/609,970

(22) Filed: Jul. 3, 2000

(30) Foreign Application Priority Data

Aug. 23, 1999 (KR) .............................................. 99-34963

(51) Int. Cl.[7] .............................................. H01L 29/00

(52) U.S. Cl. ...................... 257/529; 257/209; 257/665; 438/601; 438/132; 438/238; 438/631; 438/281

(58) Field of Search ................................. 438/281, 601, 438/132, 238, 631; 257/529, 209, 665

(56) References Cited

U.S. PATENT DOCUMENTS

| 5,457,059 | A | | 10/1995 | Keller et al. | |
|---|---|---|---|---|---|
| 5,472,901 | A | | 12/1995 | Kapoor | |
| 5,914,524 | A | * | 6/1999 | Komenaka | 257/529 |
| 5,936,296 | A | * | 8/1999 | Park et al. | 257/529 |
| 6,074,940 | A | * | 6/2000 | Lee et al. | 438/601 |
| 6,300,233 | B1 | * | 10/2001 | Lee et al. | 438/601 |

* cited by examiner

*Primary Examiner*—Matthew Smith
*Assistant Examiner*—V. Yevsikov
(74) *Attorney, Agent, or Firm*—Birch, Stewart, Kolasch & Birch, LLP

(57) ABSTRACT

The semiconductor device includes a semiconductor substrate, an insulating layer on the semiconductor substrate wherein a groove is patterned to a predetermined depth in an upper surface of the insulating layer, a fuse layer at sidewalls and on a bottom of the groove, and a wire connected electrically to the fuse layer.

5 Claims, 8 Drawing Sheets

FUSE IN SEMICONDUCTOR DEVICE AND FABRICATING METHOD THEREOF

BACKGROUND OF THE INVENTION

1. Field of Invention

The present invention relates to a fuse in a semiconductor device and to a fabricating method thereof, which provides a fuse that is easily melted and cut off by a low current.

2. Discussion of Related Art

FIG. 1A to FIG. 1G show cross-sectional views of fabricating a fuse in a semiconductor device, according to a related art.

Referring to FIG. 1A, integrated circuit portions 10 are formed on a semiconductor substrate 11. A MOS transistor 12 including a source and a drain region 14 and 15, which are surrounded by a LOCOS oxide layer 19, is formed in the substrate. By a conventional method, a planarized oxide layer 20 is formed on the LOCOS oxide layer 19 and transistor 12. The semiconductor substrate may be one of doped silicon, undoped silicon, or other semiconductor substances. Referring to FIG. 1B, a TiW layer 22, about 500 Å thick, is deposited on the oxide layer 20. An Al alloy layer 23, 2000 to 3000 Å thick, is deposited on the TiW layer 22. A TiW fuse is generated from the TiW layer 22, which will be explained in the following description. Referring to FIG. 1C, the Al alloy layer 23 is coated with a photoresist layer 25. Contact windows 26 are formed by photolithography. Referring to FIG. 1D, holes 26 are formed by removing the Al alloy layer 23, TiW layer 22 and oxide layer 20.

Referring to FIG. 1E, after the photoresist layer 25 has been removed, the holes 26 are filled up with TiW and CVD tungsten, forming contact posts 28 on the source and drain regions 14 and 15. Tungsten for the contact posts 28 uses the Al alloy layer 28 as an etch stop layer and is planarized by REB(resistive etch back), or the like.

Referring to FIG. 1F, a subsidiary Al alloy layer 30 is deposited. The subsidiary Al alloy layer 30 is coated with a photoresist layer 31. Then, leads are formed by etching the Al alloy layers 30 and 23 by lithography.

Referring to FIG. 1G, after the photoresist layer 31 has been removed, another photoresist layer 33 is formed on the above structure and patterned by lithography. The TiW layer for a fuse material is etched using the Al alloy layer as a mask, leaving a fuse part 34 between contact elements working as an electrical access.

Unfortunately, in the related art, the applied current or voltage necessary to activate the fuse is relatively high, since the bottom of the fuse pattern is planarized. Therefore, the fusing function fails to work well, due to the uniform thickness of the fuse material. Further, various fuse materials cause malfunction in the fusing function.

SUMMARY OF THE INVENTION

Accordingly, the present invention is directed to a fuse and a fabricating method thereof that substantially obviates one or more of the problems due to limitations and disadvantages of the related art.

The object of the present invention is to provide a fuse and a fabricating method thereof which provides a fuse easy to manufacture and which functions in a superior way.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a device-isolating layer surrounding an active area on a semiconductor substrate of a first conductive type, forming a MOS transistor having a source and a drain of a second conductive type in the active area, forming a groove on the device-isolating layer to a predetermined depth, forming an insulating interlayer on the substrate including the groove wherein the insulating interlayer replicates a pattern of the groove, depositing a barrier metal for a fuse on the insulating interlayer including the replicated groove by sputtering, depositing Al on the barrier metal, forming a wire consisting of the Al and barrier metal by patterning the Al and barrier metal, and forming a fuse layer consisting of the barrier metal by removing the Al of the wire corresponding to the groove.

In another aspect, the present invention includes a semiconductor substrate, an insulating layer on the semiconductor substrate wherein a groove is patterned to a predetermined depth in an upper surface of the insulating layer, a fuse layer at sidewalls and on a bottom of the groove, and a wire connected electrically to the fuse layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

Figure 1A:
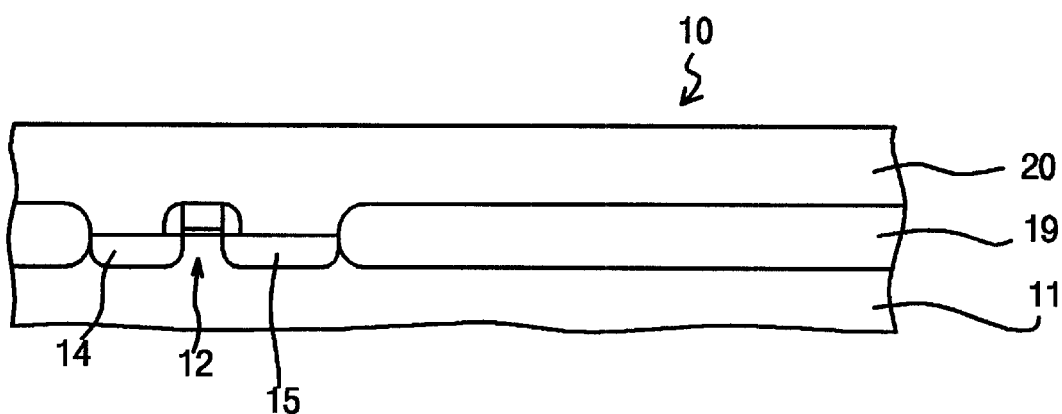
FIG. 1A to FIG. 1G show cross-sectional views of fabricating a fuse in a semiconductor device, according to a related art.
Figure 1B:
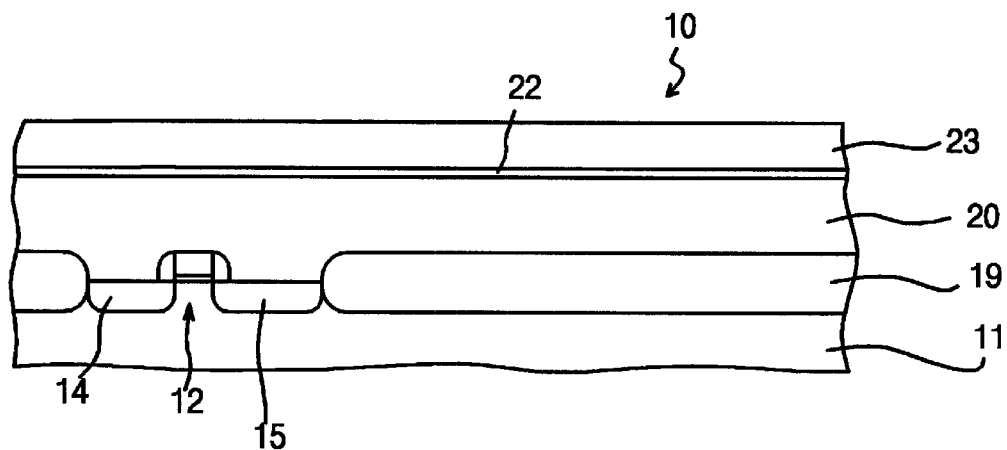
Figure 1C:
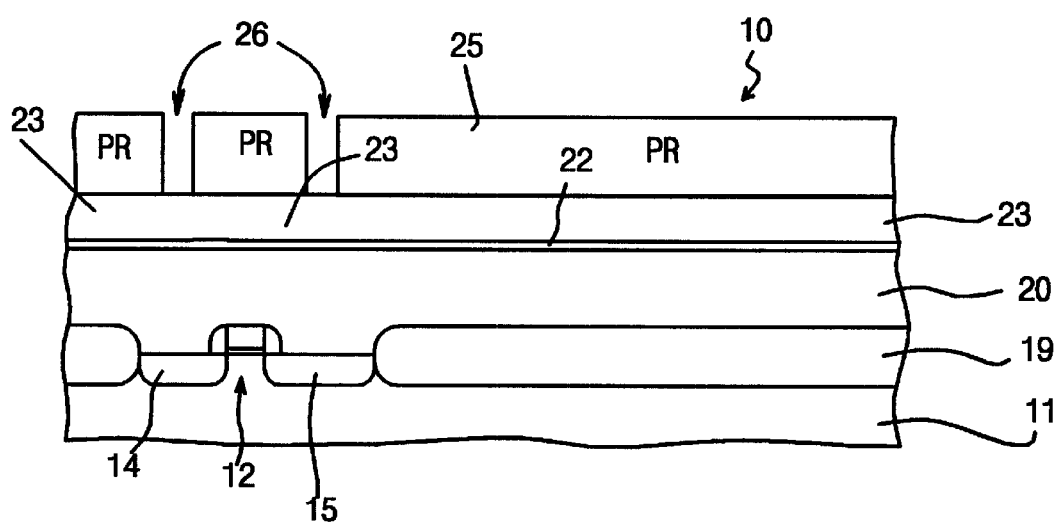
Figure 1D:
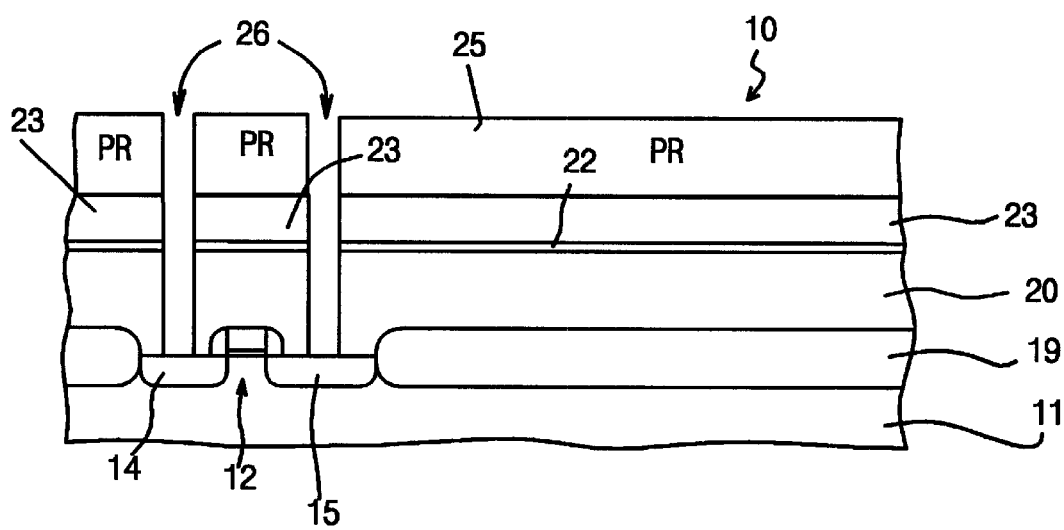
Figure 1E:
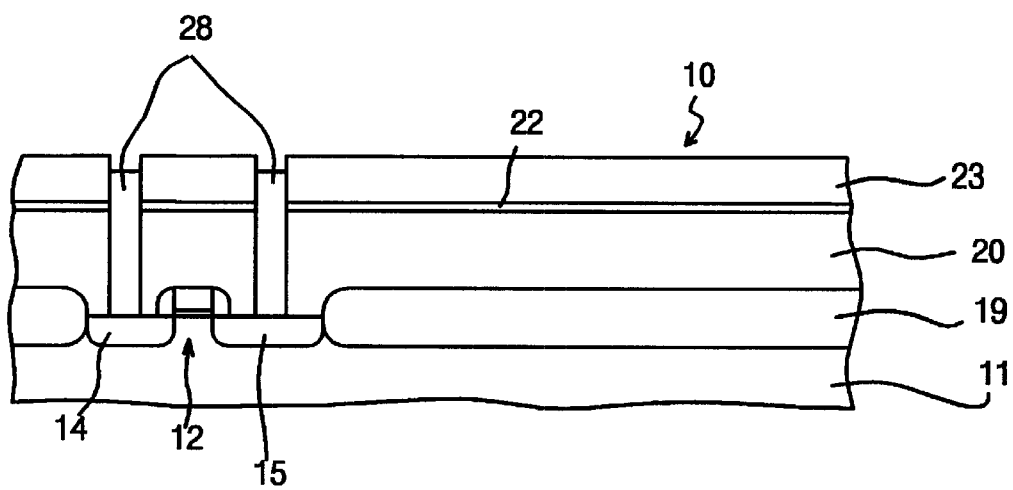
Figure 1F:
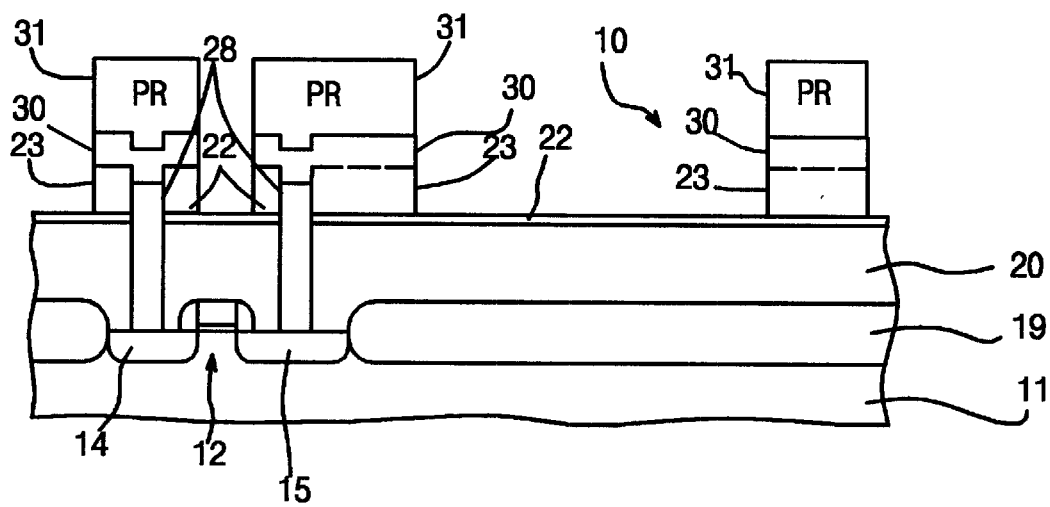
Figure 1G:
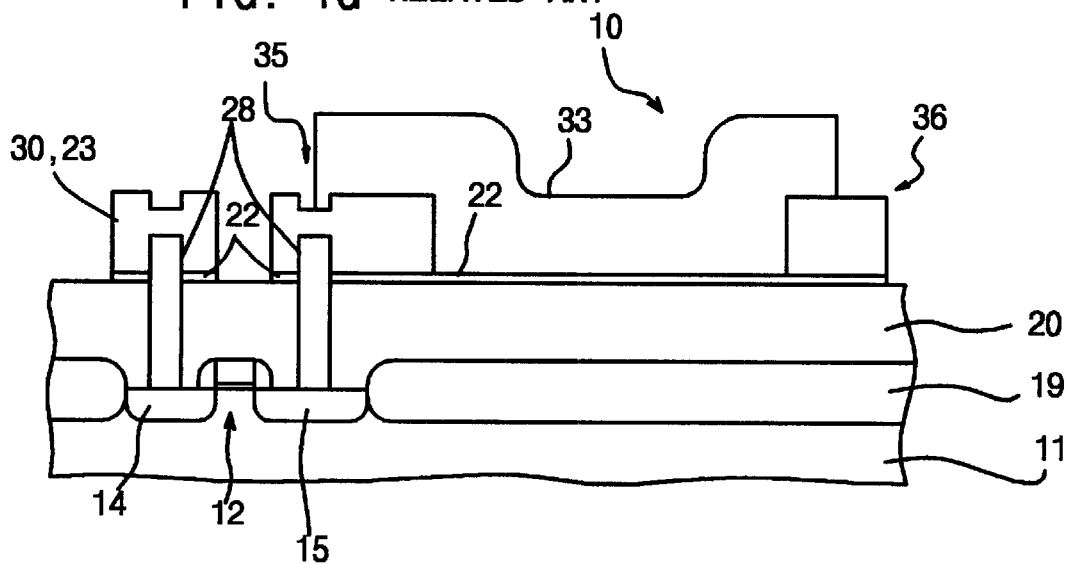
Figure 2:
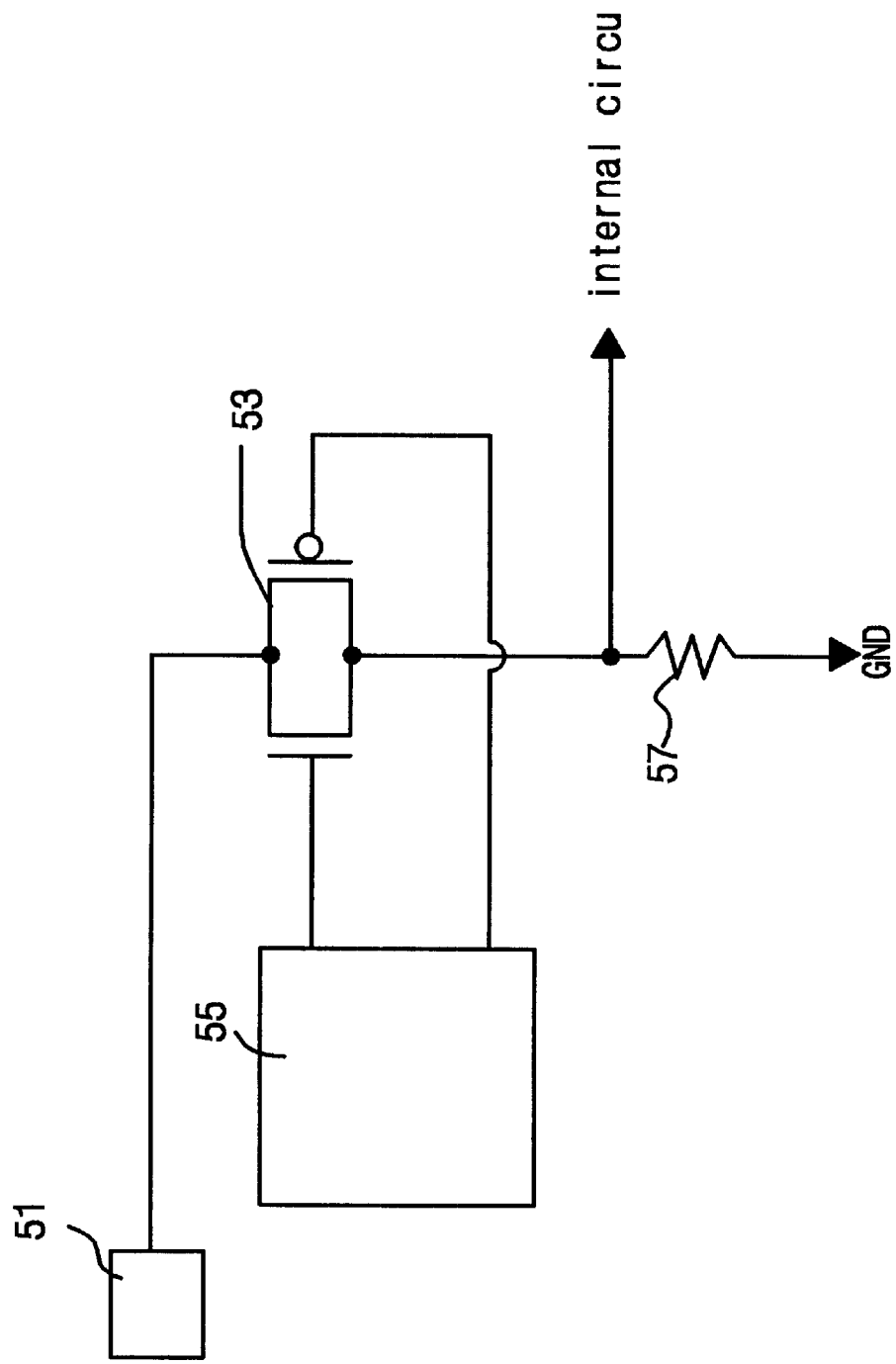
FIG. 2 shows a circuit of a semiconductor device including a fuse pattern, according to the present invention.

FIG. 2 shows a circuit of a semiconductor device including a fuse pattern according to the present invention. Referring to FIG. 2, a fuse pad 51, which is used as a VDD pad of a chip, is used as a fusing pad. The dimension of the pad 51 is about 86 μm. An applied voltage across the fusing material is a maximum 5V. In this case, the fuse material is cut off by a current exceeding 100 mA.

A transmission gate 53 is operated through a control logic block 55. Then, current is applied to the fuse material(fuse resistor) by the voltage applied to the fuse pad 55. In this case, other blocks are prevented from receiving the current.

Figure 3:
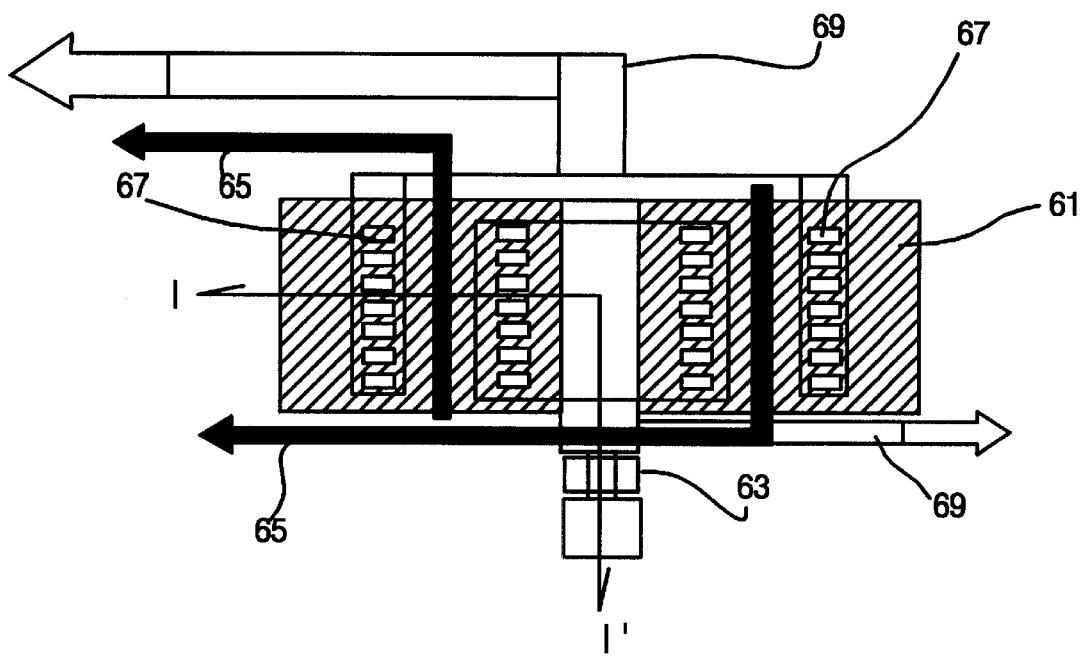
FIG. 3 shows a layout of the circuit in FIG. 2.

FIG. 3 shows a layout of the circuit in FIG. 2. Referring to FIG. 3, numerals 61, 63, 65, 67, and 69 designate an active pattern, a fuse pattern, and a gate pattern of a transistor, a contact, and a metal pattern, respectively. The gate and active patterns 65 and 61 constitute the transmission gate, and the gate pattern 65 is connected to the control logic block. One stage of the metal pattern 69 is connected to the fuse pad, the other stage is connected to a ground through the fuse part, and another stage is connected to the inner circuit.

Figure 4A:
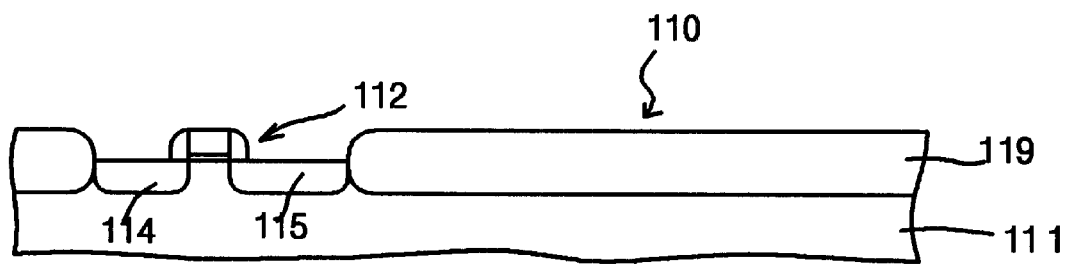
FIG. 4A to FIG. 4D show cross-sectional views of fabricating a fuse in a semiconductor device, as viewed along a cross-section line I–I' in FIG. 3.

FIG. 4A to FIG. 4D show cross-sectional views of fabricating a fuse in a semiconductor device as viewed along a cross-sectional line I–I' in FIG. 3. Referring to FIG. 4A, integrated circuit portions 110 are formed on a semiconductor substrate 111. A MOS transistor 112 including a source and a drain region 114 and 115, which are surrounded by a LOCOS oxide layer 119, is formed in the substrate. The semiconductor substrate may be one of p-typed impurity doped silicon, undoped silicon, or other semiconductor substances. The source and drain are n+ type. A thickness of the LOCOS oxide layer 119 is about 3000 Å.

Figure 4B:
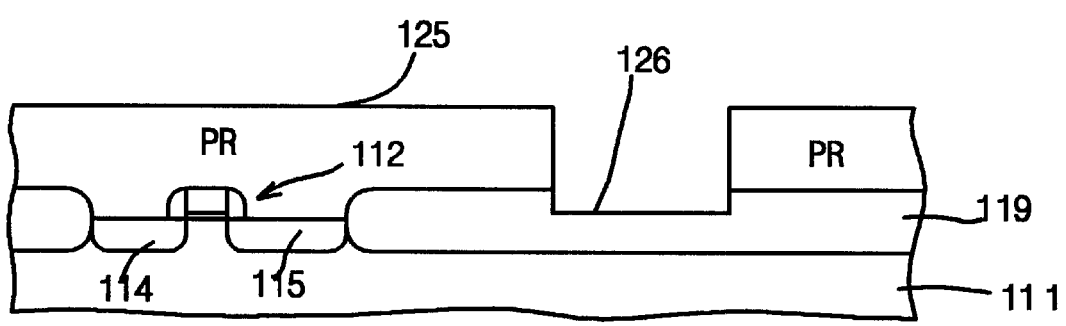

Referring to FIG. 4B, the above structure is coated with a photoresist layer 125. Contact windows 126 are formed by lithography. A portion of the LOCOS oxide layer 119 is removed to the thickness of 1500 Å by dry etching, using the photoresist layer 125 as a mask, thereby forming a groove 126. In this case, dimension of the fuse window 126 is 0.41 $\mu$m 2.0 $\mu$m, 0.4 $\mu$m 3.0 $\mu$m, or 0.4 $\mu$m 4.0 $\mu$m by the design rule of 0.35 $\mu$m.

Figure 4C:
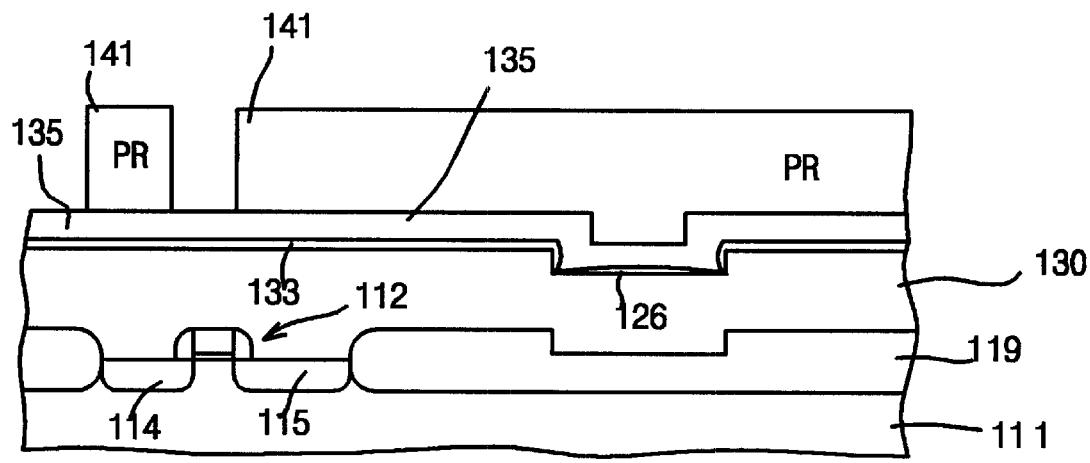

Referring to FIG. 4C, after the photoresist layer 125 has been removed, an oxide layer 130 of boro phospho silicate glass is deposited. Contact holes(not shown in the drawing) are formed by carrying out a contact photo/etch method on the oxide layer 130. A barrier layer 133 is formed by depositing Ti and TiN 400 and 800 Å thick, respectively. An Al alloy layer 135, 5000 Å thick, is deposited on the barrier layer 133.

The Al alloy layer 135 is coated with a photoresist layer 141. The photoresist layer 141 is patterned by exposure and development. Then, a metal wire is formed by etching the Al alloy layer 135 and barrier layer 133 by lithography.

In this case, the oxide layer of BPSG replicated by the groove pattern of the LOCOS oxide layer 119 has the same pattern of the groove. The barrier layer 133 is formed by sputtering, which is carried out by sputtering equipment after the removal of a collimator, of Ti and TiN. As a result, the step coverage of Ti and TiW at the lower corner of the groove 126, is inferior to that of others. Besides, thickness of the barrier layer 133 thereon is not uniform and very thin.

In general sputtering equipment, a collimator, having holes like a beehive, is inserted between a target and a semiconductor wafer. The collimator makes the deposited substance go straight ahead, thereby providing uniform thickness at the bottom and edge of the contact holes. Namely, the step coverage thereon becomes excellent.

Figure 4D:
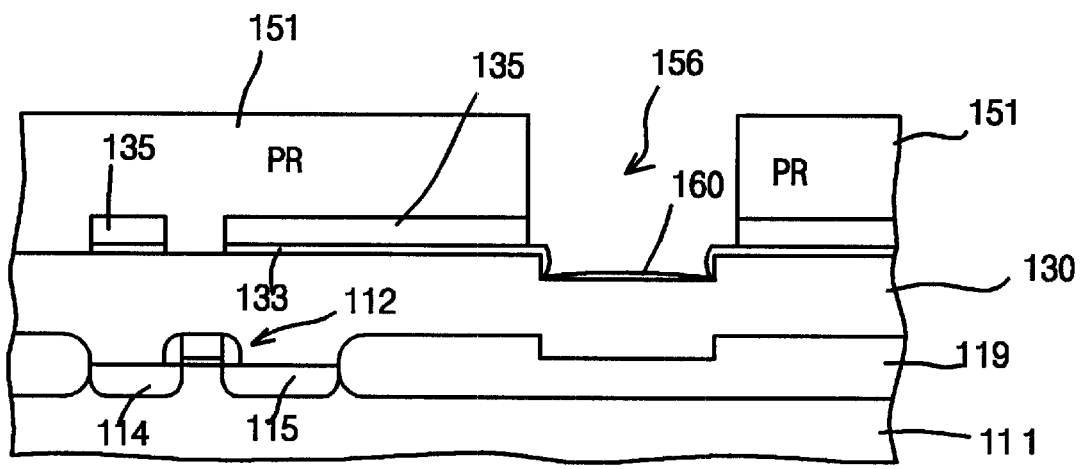

Referring to FIG. 4D, after the photoresist layer 141 has been removed, the above structure is coated with a photoresist layer 151. Then, a fuse window is formed for forming a fuse of a barrier metal consisting of Ti and TiN by carrying out lithography on the photoresist layer 151. A fuse layer 160 is formed by removing the Al alloy layer 135 in the fuse window 156 by selective etching.

As mentioned in the above description, the present invention includes the steps of forming a device-isolating layer surrounding an active area on a semiconductor substrate of a first conductive type, forming a MOS transistor having a source and a drain of a second conductive type in the active area, forming a groove on the device-isolating layer to a predetermined depth, forming an insulating interlayer on the substrate including the groove, wherein the insulating interlayer replicates a pattern of the groove, depositing a barrier metal for a fuse on the insulating interlayer, including the replicated groove, by sputtering, depositing Al on the barrier metal, forming a wire consisting of the Al and barrier metal by patterning the Al and barrier metal, and forming a fuse layer consisting of the barrier metal by removing the Al of the wire corresponding to the groove.

Accordingly, the present invention provides a fuse easily melted and cut off by low current or low voltage by means of making the step coverage of the barrier metal(Ti, TiN) at the lower corner of the groove poor as the fuse pattern is placed on the insulating layer having the groove thereon. The barrier metal for a fuse is deposited by sputtering without using a collimator.

It will be apparent to those skilled in the art that various modifications and variations can be made in a fuse in a semiconductor device and fabricating method thereof of the present invention without departing from the spirit or scope of the invention. Thus, it is intended that the present invention cover the modifications and variations of this invention provided they come within the scope of the appended claims and equivalents.

What is claimed is:

1. A fuse in a semiconductor comprising:
   a semiconductor substrate;
   an insulating layer on the semiconductor substrate, wherein a groove is patterned to a predetermined depth in an upper surface of the insulating layer;
   a fuse layer at sidewalls and on a bottom of the groove; and
   a wire connected electrically to the fuse layer, wherein a thickness of the fuse layer becomes thin at an intersection between the sidewalls and the bottom of the groove.

2. The fuse in the semiconductor device according to claim 1, wherein the insulating layer is made of oxide.

3. The fuse in the semiconductor device according to claim 1, wherein the predetermined depth amounts to 1500 Å.

4. The fuse in the semiconductor device according to claim 1, wherein the fuse layer consists of Ti and TiN.

5. The fuse in the semiconductor device according to claim 1, wherein the wire is made of Ti, TiN and Al.

* * * * *